United States Patent
Vincent et al.

(10) Patent No.: US 8,247,313 B2
(45) Date of Patent: Aug. 21, 2012

(54) METHOD FOR PREPARING A GERMANIUM LAYER FROM A SILICON-GERMANIUM-ON-ISOLATOR SUBSTRATE

(75) Inventors: Benjamin Vincent, Grenoble (FR); Jean-Francois Damlencourt, Laval (FR); Yves Morand, Grenoble (FR)

(73) Assignees: Commissariat a l'Energie Atomique, Paris (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 12/525,756

(22) PCT Filed: Feb. 7, 2008

(86) PCT No.: PCT/EP2008/051511
§ 371 (c)(1),
(2), (4) Date: Aug. 4, 2009

(87) PCT Pub. No.: WO2008/101813
PCT Pub. Date: Aug. 28, 2008

(65) Prior Publication Data
US 2010/0035414 A1   Feb. 11, 2010

(30) Foreign Application Priority Data
Feb. 8, 2007   (FR) ..................... 07 53146

(51) Int. Cl.
*H01L 21/20* (2006.01)
*H01L 21/336* (2006.01)

(52) U.S. Cl. ................. 438/479; 438/151; 257/E21.09; 257/E21.415

(58) Field of Classification Search .............. 438/151, 438/479, 682, 683; 257/E21.09, E21.415, 257/E21.154
See application file for complete search history.

(56) References Cited

U.S. PATENT DOCUMENTS

| | | | | |
|---|---|---|---|---|
| 5,459,087 A | * | 10/1995 | Mochizuki | 438/575 |
| 6,524,935 B1 | * | 2/2003 | Canaperi et al. | 438/478 |
| 6,724,008 B2 | * | 4/2004 | Fitzgerald | 257/19 |
| 7,259,388 B2 | * | 8/2007 | Langdo et al. | 257/18 |

(Continued)

FOREIGN PATENT DOCUMENTS

KR   2001-0061783   7/2001

OTHER PUBLICATIONS

C. Deguet, et al., "200 MM Germanium-On-Insulator (GEOI) Structures Realized From Epitaxial Wafers Using the Smart Cut™ Technology", ECS 2005 Conference Proceedings, 11 pages.

(Continued)

*Primary Examiner* — Matthew W Such
*Assistant Examiner* — Monica D Harrison
(74) *Attorney, Agent, or Firm* — Oblon, Spivak, McClelland, Maier & Neustadt, L.L.P.

(57) ABSTRACT

A method for making a germanium-on-insulator layer from an SGOI substrate, including: a) depositing on the substrate a layer of a metallic element M capable of selectively forming a silicide, the layer being in contact with a silicon-germanium alloy layer; and b) a reaction between the alloy layer and the layer of a metallic element M, by which a stack of M silicide-germanium-insulator layers is obtained. Such a method may, for example, find application to production of electronic devices such as MOSFET transistors.

13 Claims, 1 Drawing Sheet

U.S. PATENT DOCUMENTS 7,618,891 B2 * 11/2009 Fang et al. .................... 438/655
2005/0042842 A1 2/2005 Lei et al.

OTHER PUBLICATIONS

Yaocheng Liu, et al., "High-quality single-crystal Ge on insulator by liquid-phase epitaxy on Si substrates", Applied Physics Letters, vol. 84, No. 14, Apr. 5, 2004, pp. 2563-2565.

Shu Nakaharai, et al., "Characterization of 7-nm-thick strained Ge-on-insulator layer fabricated by Ge-condensation technique", Applied Physics Letters, vol. 83, No. 17, Oct. 27, 2003, pp. 3516-3518.

U.S. Appl. No. 12/525,756, filed Aug. 4, 2009, Vincent, et al.
U.S. Appl. No. 12/560,867, filed Sep. 16, 2009, Vincent, et al.

* cited by examiner

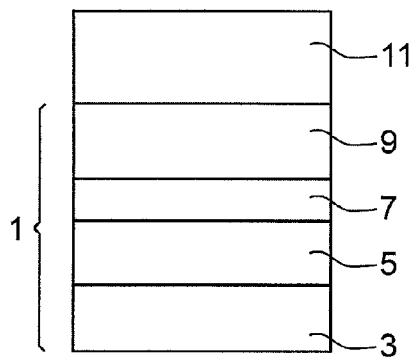
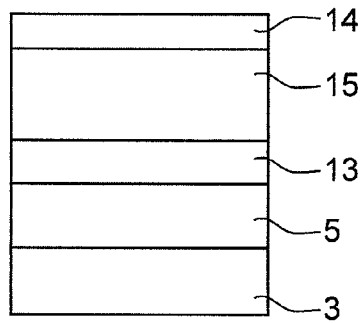
FIG.1A     FIG.1B
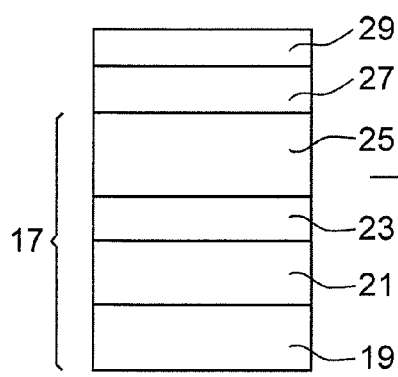
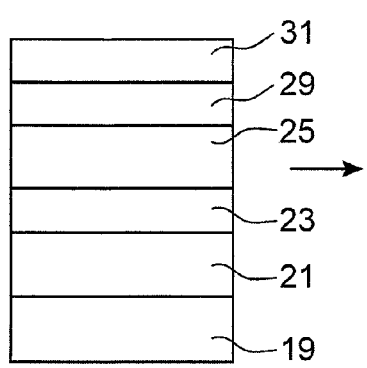
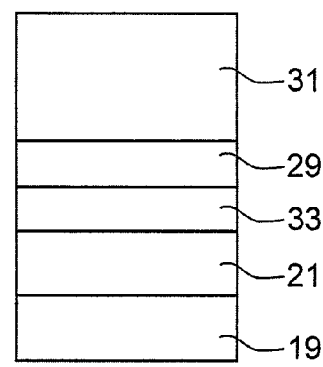
FIG.2A     FIG.2B     FIG.2C
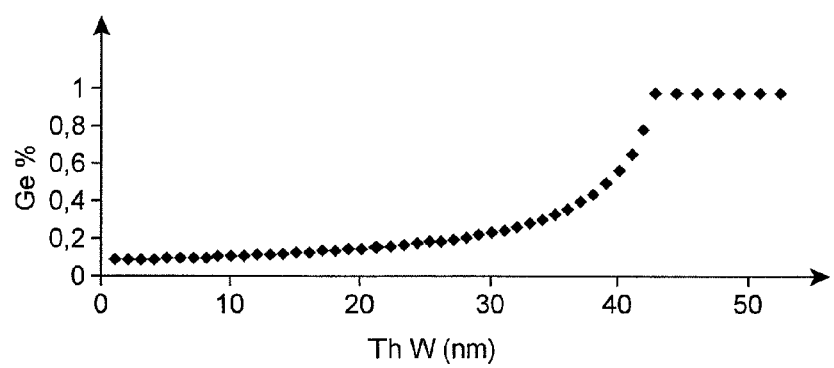
FIG.3

METHOD FOR PREPARING A GERMANIUM LAYER FROM A SILICON-GERMANIUM-ON-ISOLATOR SUBSTRATE

TECHNICAL FIELD

The invention relates to a method for making a germanium layer from a silicon-germanium-on-insulator substrate (referred to below as an SGOI substrate) on which a suitable metal layer is deposited.

This method may be used in particular to prepare MOS field-effect transistors (referred to as MOSFET transistors).

The general field of the invention is therefore that of microelectronics.

Microelectronic technologies have hitherto been based mainly on the use of silicon. However, in view of the need to make faster and faster devices, the replacement of silicon by a semiconductor having a carrier mobility higher than that of silicon has been widely envisaged. Germanium satisfies this criterion, because it has the feature of exhibiting a higher hole and electron mobility than silicon. However, germanium inherently exhibits strong leakage currents, which means that it can only be used in the form GeOI, i.e. germanium-on-insulator, by virtue of which the leakage currents are reduced and the germanium is used in very small quantities, thus reducing the mass of the substrates.

Various techniques have been proposed in the literature for fabricating germanium-on-insulator or silicon-germanium-on-insulator (SGOI) substrates.

For instance, the article entitled "200 mm *Germanium-on-insulator (GeOI) structures realized from epitaxial wafers using the smart CUT™ technology*" appearing in "*ECS 2005 Conference Proceedings*" by Deguet et al. [1], describes a method employing the following steps overall:

- a step of depositing an oxide layer, intended to constitute a buried oxide layer, on a silicon wafer having a germanium layer on the surface;
- a step of fixing this wafer, after processing it, on a base substrate, the fixing being carried out by means of the oxide layer;
- a step of cleaving the structure obtained, so as to uncover the germanium layer, following which a germanium-on-insulator substrate is obtained.

Owing to these latter steps, this method is complex to carry out and is expensive. What is more, it does not allow co-integration of silicon-on-insulator/germanium-on-insulator structures.

A second approach consists in making a germanium-on-insulator substrate by liquid phase epitaxial growth of germanium, as ascribed in *Applied Physics Letters*, Vol. 84, No 14, pages 2563-2565 [2]. It consists in depositing a nitride layer on a silicon substrate then, after making nucleation windows through this nitride layer, in sputter-depositing a germanium layer which is in contact with the nitride layer and the silicon substrate through the said windows. After encapsulation, the resulting structure is heated to the melting temperature of germanium, so that the germanium recrystallizes by propagating through the nucleation windows to the nitride layer in order to form a structure respectively comprising a silicon substrate, a nitride layer and a germanium layer. This technique is laborious, however, and the recrystallization is limited both in extent and in geometry because of the interface stability problems.

The last technique proposed in the literature is the germanium condensation method as described in *Applied Physics Letters*, Vol. 83, No 17, pages 3516-3518 [3]. This technique is based on the principle of oxidizing silicon selectively with respect to germanium. The first step consists in epitaxial growth of a silicon-germanium alloy layer SiGe on a silicon-on-insulator substrate (SOI). The second step is high-temperature dry oxidation making it possible to form exclusively silicon oxide $SiO_2$ owing to a negative enthalpy of formation greater than that of germanium oxide $GeO_2$. During the oxidation, the germanium becomes trapped between two barriers: the interface with the buried oxide and the interface with the silicon oxide undergoing formation. The germanium remains confined between these two barriers, whereas the silicon diffuses in the direction of the silicon oxide layer being formed. As the thickness of the silicon-germanium alloy decreases, the germanium concentration is enriched during the oxidation and can reach 100% to form a GeOI with a suitable oxidation time. At the end of the process, however, when all of the silicon has been consumed, the germanium is in turn oxidized to a layer of germanium oxide $GeO_2$. In view of the very fine GeOI thicknesses obtained (of the order of 10 nm), total consumption of the germanium can occur very rapidly. Thus, in order to obtain GeOI substrates (germanium-on-insulator), the process time must be precisely calculated in order to oxidize the silicon without consuming the germanium. It has also been observed that minor differences in the silicon thickness of the SOI, and the thickness and concentration of the epitaxially grown SiGe alloy, produce enormous differences in the thickness and concentration of the germanium after condensation. Even the best starting structures, with the most homogeneous SOI substrate existing and epitaxy optimized as well as possible, do not allow homogeneous structures to be obtained after condensation. Thus, local consumption of germanium by oxidation is inevitable when the enrichment reaches 100% to produce GeOI.

There is therefore a genuine need in terms of a method for fabricating a germanium layer from an SGOI substrate, which prevents consumption of the germanium once all the silicon has been consumed, and which can furthermore optionally allow SOI-GeOI co-integration.

SUMMARY OF THE INVENTION

Surprisingly, the inventors have discovered that by carrying out a siliciding reaction which is selective with respect to a germaniding reaction, it is possible to overcome the drawbacks of the prior art and in particular to prevent consumption of the germanium once the silicon has been consumed.

Thus, the invention relates to a method for making a germanium-on-insulator layer from an SGOI substrate, comprising:

a) a step of depositing on the said substrate a layer of a metallic element M capable of selectively forming a silicide, the said layer being in contact with a silicon-germanium alloy layer;

b) a step of a reaction between the said alloy layer and the said layer of a metallic element M, by means of which a stack of M silicide-germanium-insulator layers is obtained.

The method of the invention thus has the following advantages over the prior art methods:

it makes it possible to obtain a germanium layer which is not consumed under the operating conditions of the method;

from a silicon-germanium alloy, it makes it possible to obtain a layer comprising all the germanium present in the alloy because the germanium is not consumed under the operating conditions of the method, whereas the silicon of the alloy is fully consumed to form the M silicide;

it makes it possible to obtain SOI and GeOI structures on the same wafer, allowing co-integration.

According to the invention, the said substrate (on which the metal layer is deposited) is an SGOI, that is to say a silicon-germanium-on-insulator substrate; the insulator may form a buried oxide, for example silicon oxide. The insulator may also consist of an air layer. This substrate may comprise an intermediate layer of metallic silicon between the insulator layer and the silicon-germanium alloy layer. The insulator layer, for its part, may rest on a metallic silicon layer. In particular, the SGOI substrate may respectively comprise a silicon base layer, a buried oxide layer on the said base layer and a silicon-germanium alloy layer on the said buried oxide layer. The SGOI substrate may furthermore comprise a silicon layer between the said buried oxide layer and the said silicon-germanium alloy layer. Preferably, the silicon-germanium alloy layer is monocrystalline.

According to the first step of the method, a layer of a metallic element M capable of selectively forming a silicide is deposited on the SGOI substrate, this layer thus being in contact with the silicon-germanium alloy layer. Particularly when the insulator of the substrate consists of an air layer, the step of depositing a layer of a metallic element M may be carried out on all the faces of the silicon-germanium alloy layer.

A layer of M silicide may also be deposited on the said layer of a metallic element M, depending on the embodiment envisaged, this deposition step being carried out between step a) and step b).

The metallic element M should be capable of reacting exclusively with silicon to form an M silicide and thus form a barrier against diffusion of the germanium.

A suitable metallic element M satisfying this criterion may advantageously be selected from tantalum, rhenium and tungsten.

The metallic element M is preferably tungsten. The thickness will preferably be selected to be larger than the thickness necessary to consume all the silicon.

According to the second step of the method of the invention, reaction is carried out between the layer of metallic element M and the silicon-germanium alloy layer, the layer of metallic element M reacting selectively with the silicon in order to form an M silicide and all of the silicon of the alloy being consumed to form the silicide, by means of which the following sequence of layers is obtained at the end of this step:

optionally a layer of unreacted M;
a layer of M silicide lying on top of a germanium layer;
a germanium layer lying on top of the insulator.

The reaction step may be carried out according to two embodiments, namely:

either by a step of annealing in a neutral atmosphere;
or by an oxidation step, in which case a layer of M silicide will advantageously lie on top of the layer of a metallic element M before the reaction, and by means of which a stack of silicon oxide-M silicide-germanium-insulator is obtained after this step.

In order to expose the germanium layer which has been formed, the method of the invention may comprise a step of removing the silicon oxide layer and/or the M silicide layer.

In the event that the insulator of the SGOI substrate consists of an air layer, a structure comprising two layers may be obtained after the method: a layer of silicon oxide and/or M silicide lying on top of a germanium layer. After removing the layer of silicon oxide or M silicide, a layer of pure germanium will remain. It is to be understood that this germanium layer will be connected by supporting points to another substrate.

The method of the invention can thus make it possible to produce a suspended bridge of germanium, which may be referred to as "GON" corresponding to the term "germanium-on-nothing", this suspended bridge being connected to another substrate by two support points.

The invention will now be described in more detail with reference to the following embodiments and the appended figures.

BRIEF DESCRIPTION OF THE FIGURES

FIGS. 1A and 1B are views in cross section illustrating the method of the invention according to a first embodiment.

FIGS. 2A to 2C are views in cross section illustrating the method of the invention according to a second embodiment.

FIG. 3 represents a graph illustrating the germanium enrichment (% Ge) as a function of the deposited tungsten thickness Th W (in nm) for a substrate comprising a 100 nm layer of $Si_{0.9}Ge_{0.1}$ alloy and an SOI support with a 20 nm layer of silicon.

DETAILED DESCRIPTION OF PARTICULAR EMBODIMENTS

As mentioned above, the method according to the invention makes it possible to fabricate a germanium layer from an SGOI substrate based on a selective siliciding reaction.

FIGS. 1A and 1B illustrate a first embodiment of the invention.

FIG. 1A shows an SGOI substrate 1 suitable for carrying out the present invention. The substrate 1 comprises a base support made of silicon 3. The support 3 respectively carries a buried oxide layer 5, a silicon layer 7 and a silicon-germanium alloy layer 9. The buried oxide layer may conventionally be a silicon oxide layer. The silicon-germanium alloy layer 9 is covered with a layer 11 of a metallic element M, which is capable of selectively forming a silicide. This layer 11 is generally deposited by chemical vapour deposition (corresponding to the abbreviation CVD) or may be pulsed onto the SGOI substrate 1. According to this embodiment, the substrate thus obtained is subjected to a step of annealing in a neutral atmosphere.

This annealing step allows diffusion of the silicon present in the silicon layer 7 and in the silicon-germanium alloy layer 9 to the layer 11 of a metallic element M the said silicon atoms reaching with M so as to form a layer of M silicide. The germanium atoms also diffuse but remain localized between the buried oxide layer and the silicide layer being formed, because the germanium does not react with the atoms of M to form a germanide.

It should be pointed out that a neutral atmosphere is intended to mean an atmosphere free of oxygen and any oxidizing or reducing reactive compound; this atmosphere may be a nitrogen atmosphere or an atmosphere of a rare gas such as argon.

The annealing step is highly advantageously carried out at a temperature below the melting temperature of germanium (namely 938.3° C.) but at a temperature effective in allowing diffusion of the germanium and the silicon in the silicon-germanium alloy, preferably above 700° C. This diffusion will make it possible to replace germanium by silicon at the interface of the alloy layer and the layer of metallic element M, so as to create a driving force for the selective siliciding reaction. The metallic element M constituting the layer M may be tungsten, rhenium and tantalum. As regards rhenium and tantalum, the temperature of the annealing step will advantageously lie in the range extending from 700 to 900° C.

During the annealing step according to this embodiment, the silicon of the silicon layer 7 and of the alloy layer 9 is consumed to form the silicide.

Once the annealing step has been carried out, the germanium layer will be trapped between two barriers: one barrier consisting of the buried oxide layer and one barrier consisting of the silicide layer thus formed during the selective siliciding reaction. A substrate as represented in FIG. 1B is thus obtained, respectively comprising the following layers in succession:
- a silicon support 3;
- a buried oxide layer 5;
- a germanium layer 13;
- a layer 15 of M silicide;
- a layer 14 of excess M.

The thickness of the layer of M, before the selective siliciding step, will advantageously be larger than the minimum thickness necessary to consume all the silicon.

Whether for this embodiment or the other embodiments, the method of the invention makes it possible to obtain localized GeOI substrates (germanium-on-insulator) by simple deposition of a metal layer on the zones intended to be enriched with germanium. After the method, as represented in FIG. 1B, these substrates are covered with a silicide layer and, in the case in point, with a layer of excess metal M.

In order to be able to use the germanium as a substrate for the creation of electronic devices, such as MOSFET transistors, it is important to remove this silicide layer.

Thus, whether for the first embodiment described above or for other embodiments, the method of the invention may comprise a step of removing the silicide layer which has been formed. This removal step may consist in bringing the structure obtained in contact with fluoride ions and nitrogen, the fluoride ions making it possible to etch the silicide layer selectively with respect to the underlying germanium layer, and the nitrogen making it possible to passivate the germanium layer uncovered after removal of the silicide layer. A suitable mixture for supplying fluoride ions and nitrogen is the mixture $SF_6/N_2$; this mixture may be converted into the form of gaseous plasma for this removal step.

In order to achieve controlled germanium enrichment, repeating the cycle of the following steps one or more times may be envisaged:
- step of depositing a layer of metallic element M;
- selective siliciding reaction step;
- step of removing the silicide layer which has been formed.

After the step of depositing a layer of metallic element M, depositing a silicon nitride layer on it may be envisaged in order to prevent potential dewetting of the silicide during the anneal.

FIGS. 2A to 2C illustrate a second embodiment of the invention, still employing a selective siliciding step.

FIG. 2A shows an SGOI substrate 17 comprising the following sequence of layers:
- a base layer of silicon 19;
- a buried oxide layer 21 on the said base layer 19;
- a silicon layer 23 on the said buried oxide layer 21;
- a silicon-germanium alloy layer 25 on the said silicon layer 23.

A layer 27 of a metallic element M is deposited on this SGOI substrate, then a layer 29 of M silicide is deposited on this layer 27; these depositions may be carried out by chemical vapour deposition (CVD) or physical vapour deposition (PVD).

According to this embodiment, the resulting substrate is then subjected to an oxidation step, by means of which a silicon oxide layer 31 is formed on the layer 29 of M silicide.

At the same time, the silicon present in the silicon layer 23 and the silicon-germanium alloy layer 25 diffuses through the silicide layer 29 to reach the interface formed between the said silicide layer 29 and the silicon oxide layer 31 being formed (cf. FIG. 2B). The germanium present in the silicon-germanium alloy layer 25 does not diffuse through the silicide layer, because it has no affinity for the metal M and thus remains confined between the silicon layer 23 and the layer 29 of M silicide. The oxidation step is continued until total consumption of the silicon present both in the silicon layer 23 and in the silicon-germanium alloy layer 25. The silicide layer protects the germanium from the oxidation phenomenon.

The oxidation step may be carried out by dry means, for example, by heating to an oxidation temperature above 700° C. and below 938° C., for example for a time ranging from a few tens of minutes to a few hours in an oxygen atmosphere. An oxidation time of 3 hours will advantageously be selected in order to ensure total consumption of the silicon.

The oxidation step may also be carried out by wet means with an oxidation temperature lying between 700 and 938° C. in $H_2O$ and HCl.

After this embodiment, a substrate as represented in FIG. 2C is thus obtained, comprising the following layers in succession:
- a base layer 19 of silicon;
- a buried oxide layer 21 on the said base layer 19;
- a germanium layer 33 on the said buried oxide layer 21;
- a layer 29 of M silicide on the said germanium layer 33;
- a silicon dioxide layer 31 on the said layer 29 of M silicide 29.

In order to be able to use the germanium as a substrate for the creation of electronic devices, such as MOSFET transistors, it is important to remove this silicide layer and this silicon oxide layer.

In order to do so, the silicon oxide layer which has been formed may be removed by wet chemical etching (mixtures of $HF/H_2O$ or $HF/NH_4F$) or dry chemical etching. As regards the silicide layer, it may be removed in the way explained above, namely with a mixture comprising fluoride ions and a neutral gas such as $N_2$.

The exposed germanium layer can thus be used as a basis for the production of electronic devices, such as MOSFET transistors.

Besides the fact that it makes it possible to form a germanium layer from an SGOI substrate, the originality of this method also derives from the fact that it uses a layer of a metallic element in order to generate a germanium layer which will be used as a basis for the fabrication of electronic devices, whereas it is standard practice to use a layer of a metallic element only at the end of the fabrication of electronic devices, particularly in order to provide the electrical contact, this being in particular so as to avoid the contamination problems inherent in the use of this type of layer.

Thus, the invention also relates to a method for fabricating an electronic device, comprising:
- a step of carrying out the method for making a germanium-on-insulator layer from an SGOI substrate as defined above;
- a step of producing constituent elements of the said electronic device on the said germanium layer.

This electronic device may in particular be a MOSFET transistor, in which case the germanium layer may constitute the channel of this transistor, the other constituent elements to be produced on the germanium layer being the source, the drain, the gate and the spacers.

The invention will now be described with reference to the following example.

Example 1

This example illustrates the preparation of a germanium layer from substrates comprising:
- an SOI support (silicon-on-insulator) with a silicon layer having a thickness of 20 nm;
- a layer of silicon-germanium alloy $Si_{0.9}Ge_{0.1}$ having a thickness of 100 nm, epitaxially grown starting from the said silicon layer;
- a layer of tungsten with various thicknesses, so as to determine the optimal thickness for obtaining a layer of pure germanium (that is to say free of silicon).

The different tungsten thicknesses tested lie between 0 and 50 nm.

As may be seen in FIG. 3, under the operating conditions of the example, a pure germanium layer is obtained with a deposited tungsten layer thickness of more than 43 nm.

The invention claimed is:

1. A method for making a germanium-on-insulator layer from an SiGe-on-Insulator (SGOI) substrate, comprising:
   depositing, on a silicon-germanium alloy layer of the SGOI substrate, a layer of a metallic element M that reacts exclusively with silicon to form a M silicide layer, the layer of the metallic element M being in contact with the silicon-germanium alloy layer, and the metallic element M consisting of tantalum, rhenium, or tungsten; and
   causing a reaction between the silicon-germanium alloy layer and the layer of the metallic element M, by which the silicon of the silicon-germanium alloy layer is fully consumed to form the M silicide layer, thereby obtaining a stack of said M silicide layer on the germanium-on-insulator layer.

2. The method according to claim 1, wherein the metallic element M is tungsten.

3. The method according to claim 1, wherein the SGOI substrate comprises a silicon base layer, a buried oxide layer on the base layer, and the silicon-germanium alloy layer on the buried oxide layer.

4. The method according to claim 3, wherein the SGOI substrate further comprises a silicon layer between the buried oxide layer and the silicon-germanium alloy layer.

5. The method according to claim 1, wherein the causing the reaction between the layer of the metallic element M and the silicon-germanium alloy includes annealing in a neutral atmosphere at a temperature below a melting temperature of germanium.

6. The method according to claim 5, wherein the annealing is carried out at a temperature above 700° C.

7. The method according to claim 1, further comprising depositing a layer of M silicide on the layer of the metallic element M, after the depositing and before the causing the reaction.

8. The method according to claim 7, further comprising obtaining, through oxidation, a stack of silicon oxide-M silicide-germanium-on-insulator layers.

9. The method according to claim 7, further comprising removing at least one of the silicon oxide and the M silicide.

10. The method according to claim 9, further comprising removing the M silicide by bringing the layer of M silicide in contact with a mixture comprising fluoride ions and a neutral gas.

11. A method for fabricating an electronic device, comprising:
   implementing the method for making the germanium-on-insulator layer from the SGOI substrate as defined in claim 10; and
   producing constituent elements of the electronic device on the germanium-on-insulator layer.

12. The method according to claim 11, wherein the electronic device is a MOSFET transistor.

13. The method according to claim 12, wherein the constituent elements are a channel, source, drain, gate, and spacers of the MOSFET transistor.

* * * * *